(12) United States Patent
Katyal

(10) Patent No.: US 9,401,699 B2
(45) Date of Patent: Jul. 26, 2016

(54) HIGH FREQUENCY LOW-GAIN NOISE RING-TYPE VCO OSCILLATOR LEADING TO A LOW-NOISE/AREA PLL

(71) Applicant: STMicroelectronics International N.V., Amsterdam (NL)

(72) Inventor: Amit Katyal, Ghaziabad (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/090,759

(22) Filed: Nov. 26, 2013

(65) Prior Publication Data

US 2015/0145608 A1    May 28, 2015

(51) Int. Cl.
  *H03K 3/03* (2006.01)
  *H03L 7/099* (2006.01)
  *G05F 3/26* (2006.01)

(52) U.S. Cl.
  CPC .............. *H03K 3/0315* (2013.01); *G05F 3/262* (2013.01); *H03L 7/0995* (2013.01)

(58) Field of Classification Search
  CPC ........... H03L 5/00; H03L 5/02; H03L 7/0995; H03K 3/0315; G05F 3/26; G05F 3/262; G05F 3/24
  USPC ............................................ 331/57, 185, 186
  See application file for complete search history.

(56) References Cited

U.S. PATENT DOCUMENTS

| 7,388,443 | B2 | 6/2008 | Baig et al. | |
|---|---|---|---|---|
| 7,852,168 | B1 * | 12/2010 | Song et al. | 331/185 |
| 8,044,727 | B2 * | 10/2011 | Higashi | H03K 3/0315 331/117 R |
| 2004/0090281 | A1 * | 5/2004 | Vilander | 331/185 |
| 2010/0102859 | A1 * | 4/2010 | Fattaruso | H03L 7/099 327/157 |
| 2010/0141335 | A1 * | 6/2010 | Bedeschi et al. | 327/543 |
| 2010/0308912 | A1 * | 12/2010 | Siegel et al. | 330/253 |
| 2012/0092050 | A1 * | 4/2012 | Kumar et al. | 327/157 |

* cited by examiner

*Primary Examiner* — Ryan Johnson
(74) *Attorney, Agent, or Firm* — Seed IP Law Group PLLC

(57) ABSTRACT

A phase locked loop includes a voltage-controlled oscillator and a current mirror circuit that supplies a drive current to the voltage-controlled oscillator. The current mirror circuit includes a filter between a bias current generator and current mirror transistor. The filter includes a first and a second switch driven in unison with a small duty cycle.

20 Claims, 9 Drawing Sheets

FIG. 1 *(Prior Art)*

HIGH FREQUENCY LOW-GAIN NOISE RING-TYPE VCO OSCILLATOR LEADING TO A LOW-NOISE/AREA PLL

BACKGROUND

1. Technical Field

The present disclosure relates to the field of integrated circuits. The present disclosure relates more particularly to the field of voltage controlled oscillators implemented in integrated circuits.

2. Description of the Related Art

FIG. 1 is a schematic diagram of an integrated circuit die including a known voltage-controlled oscillator 21. The voltage-controlled oscillator 21 includes a first inverter 24a, a second inverter 24b, and a third inverter 24c connected in series. A PMOS transistor M1 is coupled to respective supply terminals of the first, second, and third inverters 24a-24c. The source terminal of the transistor M1 is coupled to the voltage supply terminal $V_{DD}$. The gate terminal of the transistor M1 is coupled to the control voltage terminal $V_{control}$.

The voltage-controlled oscillator 21 is a ring oscillator. The voltage-controlled oscillator 21 outputs an oscillator signal having a frequency $f_0$ from the output of the inverter 24c. The output of the inverter 24c is supplied to the input of the inverter 24a. In this way the voltage-controlled oscillator 21 receives at its input the output oscillation signal.

Because there are an odd number of inverters, and the inverter 24a receives as its input the output of the inverter 24c, an oscillating signal is generated at the output of the inverter 24c. Because the output of an inverter is the logical "not" of the input, when the input of the inverter 24a is high, the output of the inverter 24a will transition low. Because the output of the inverter 24a is coupled to the input of the inverter 24b, when the output of the inverter 24a transitions low, the output of the inverter 24b will transition high. Because the output of the inverter 24b is the input of the inverter 24c, when the output of the inverter 24b transitions high, the output of the inverter 24c will transition low. Because the output of the inverter 24c is fed back to the input of the inverter 24a, the input of the inverter 24a will transition from a previously high state to the low state of the output of the inverter 24c. When the input of the inverter 24a is low, the output of the inverter 24c will transition high. Thus, an oscillating signal is generated at the output of the inverter 24c.

Each of the transitions from high to low or low to high at the outputs of the inverters 24a-24c takes a finite amount of time. The period of the oscillator signal is the product of the number of inverters in the ring oscillator 21 multiplied by the time required for an inverter to make a single transition from a low to a high or a high to a low state multiplied by 2 because the period will include both a half on the low state and a half cycle on the high state, the high and the low state together forming one cycle. For example, if the transition time for one of the inverters of the oscillator 21 is 0.1 ns, then the total period of the oscillator signal is 0.6 ns. If the period of the oscillator signal is 0.6 ns, then the frequency of the oscillator signal, which is the inverse of the period of the oscillator signal, is about 1.67 Ghz.

The period of transition between high and low states corresponds to the time it takes for the inherent capacitors (gate-body, gate-source, gate-drain) of a transistor of the inverter to charge or discharge. The time required for the inherent capacitors of the transistor to charge or discharge depends in part on the dimensions of the gate electrode/channel region and the current that drives the inverter.

In the example of FIG. 1, the inverters 24a-24c are driven by a driving current $I_{drive}$ supplied by the transistor M1. The higher the drive current $I_{drive}$, the faster the inverters 24a-24c can transition between the high and low states. The magnitude of the drive current $I_{drive}$ is dependent on the gate-source voltage of the transistor M1. The voltage at the source of the transistor M1 is fixed at VDD. The gate terminal of the transistor M1 is coupled to a variable voltage source $V_{control}$. By adjusting the magnitude of the voltage $V_{control}$, the magnitude of the drive current $I_{drive}$ can be adjusted. Because the output frequency $f_0$ of the oscillator signal is dependent on the drive current $I_{drive}$, $f_0$ can be adjusted by adjusting the magnitude of the voltage $V_{control}$.

In the oscillator 21 of FIG. 1, to generate very high frequencies the gain of the oscillator becomes very large. For example, if the oscillator 21 has a standard output frequency $f_0$ of about 3 GHz, the gain of the oscillator can go as high as 12 GHz/V. This is because to keep M1 in saturation its size needs to be very large and thus the transconductance, $g_m$, is quite large as well. This is particularly true in oscillators with small supply voltages.

However, the drawback of such a high gain oscillator 21 is that, when implemented in a phase locked loop (PLL), the thermal noise of the resistor present in the loop filter gets multiplied by the square of the gain of the oscillator 21. This creates high phase noise in the output oscillator signal. Such high gain oscillators can make it particularly difficult to get very high performance PLLs with very low jitter. If, in order to reduce the jitter, the size of the resistor in the loop filter is reduced, the size of the capacitor in the loop filter must be increased to make the phase margin acceptable. If the size of the capacitor in the loop filter is increased then a large amount of chip area is consumed.

BRIEF SUMMARY

One embodiment is a voltage-controlled oscillator driven by a current mirror circuit. The current mirror circuit includes a driving transistor that supplies the driving current to the voltage-controlled oscillator and a biasing transistor coupled to the driving transistor in a current mirror configuration. A current source supplies the biasing transistor with a bias current. The current mirror circuit includes a filter coupled between the biasing transistor and the current source. The presence of the filter reduces the noise contribution of the bias current to the output oscillator signal of the voltage-controlled oscillator.

In one embodiment the filter includes a first switch positioned between the drain of the biasing transistor and the current source. The filter also includes a second switch coupled between the first switch and the current source. The gate terminal of the biasing transistor is coupled to a node between the first and second switches. The first and second switches are driven such that they are either both open or both closed. The first and second switches are driven with a relatively small duty cycle. In other words, the first and second searches are open for a longer period than they are closed. This enables the voltage on the gate terminal of the biasing transistor to gradually settle to a steady-state voltage. The filter also includes a capacitor coupled between the gate of the biasing transistor and Vdd or ground. The first and second switches and the capacitor act together as a filter that greatly reduces the amount of noise on the gate terminals of the biasing transistor and the driving transistor, thereby leading to a greatly reduced amount of noise in the drive current and in the output oscillator signal. This helps provide a coarse control of the VCO frequency.

In one embodiment, the fine control of the VCO frequency is done by tuning capacitors each having a first terminal coupled a respective one of the inverters. The second terminal of the tuning capacitors is coupled to the output of the loop filter to act as a control voltage. This causes the gain of the VCO to go down by N times because it has to tune for a very small range only. This leads to reducing the noise contribution of the resistance in the loop filter by $N^2$ times or if the resistance is increased by $N^2$ to create the same noise, the capacitor in the loop filter is reduced by $N^2$. This leads to a reduction in the area needed for the loop filter or a reduction in the noise in the output oscillator signal, or some split of this benefits.

DETAILED DESCRIPTION

Figure 2:
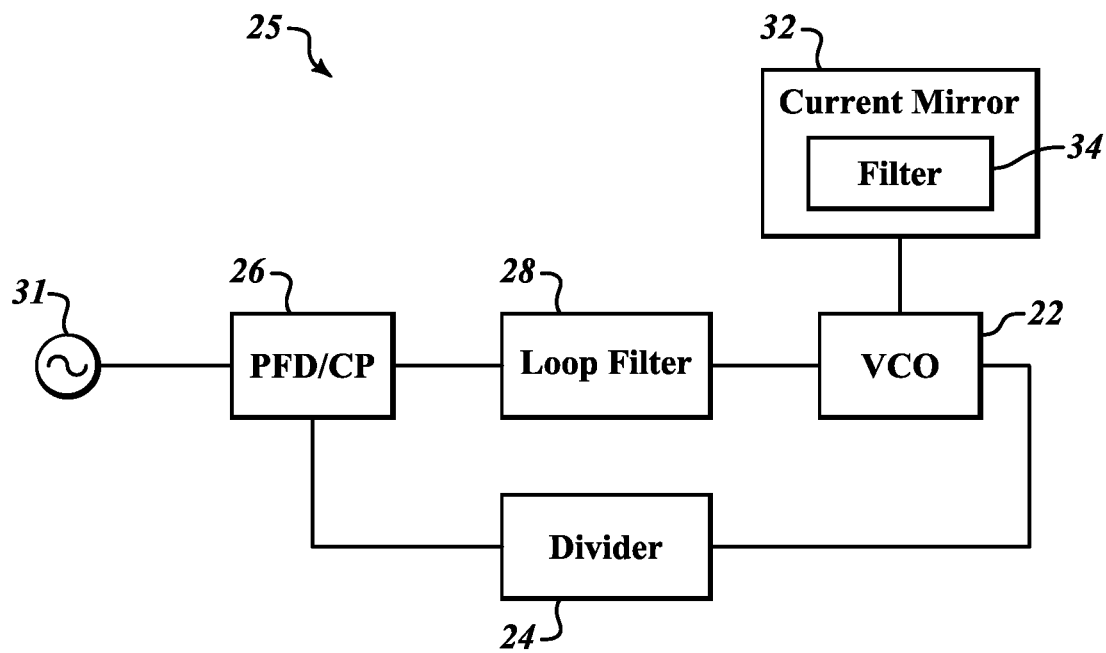
FIG. 2 is a block diagram of a phase locked loop according to one embodiment.

FIG. 2 is a block diagram of a phase locked loop 25. The phase locked loop 25 includes a voltage-controlled oscillator 22 and a frequency divider 24 coupled to the output of the voltage-controlled oscillator 22. A frequency detector 26 is coupled to the output of the frequency divider 24. A loop filter 28 is coupled between the phase detector 26 and the voltage-controlled oscillator 22. The phase detector 26 receives an input oscillator signal 31. A current mirror 32 is coupled to the voltage-controlled oscillator 22. The current mirror circuit 32 includes a filter 34.

The voltage-controlled oscillator 22 generates an output oscillator signal having a frequency $f_0$. The phase locked loop 25 is implemented in order to ensure that the phase of the output oscillator signal of the voltage-controlled oscillator 22 remains locked with the phase of the input oscillator 31. The output oscillator signal is supplied from the voltage-controlled oscillator 22 to the frequency divider 24. The frequency divider 24 divides the frequency of the oscillator signal by a factor of N, though some examples the frequency divider 24 acts as a frequency buffer and divides the frequency by 1. The frequency divider 24 outputs the divided oscillator signal to the phase detector 26. The phase detector 26 outputs a phase error signal proportional to the phase difference between the input oscillator 31 and the divided oscillator signal. The phase error signal is provided to the loop filter 28 which filters the phase error signal and supplies it to the voltage-controlled oscillator 22. By supplying the phase error signal to the voltage-controlled oscillator 22, the phase of the output oscillator signal is locked to the phase of the input oscillator signal 31. As described previously, in order to reduce jitter and maintain good phase margin, the capacitor within the loop filter 28 may need to have a relatively large area, thereby consuming a large amount of area with the integrated circuit in which a phase locked loop 25 is implemented.

This problem can be alleviated by reducing the gain of the voltage-controlled oscillator 22. The gain of the voltage-controlled oscillator can be reduced by implementing the current mirror circuit 32 to supply the drive current to the voltage-controlled oscillator 22 to do coarse locking and then using tuning capacitors to do fine tuning as described in more detail below with respect to FIG. 3.

In one embodiment, the drive current is supplied from a drive transistor having a gate terminal tied to the gate terminal of a bias transistor which receives a bias current from a bias current generator. This provides a relatively constant drive current far less dependent on the control voltage which is applied elsewhere in the current mirror circuit 32.

Figure 1:
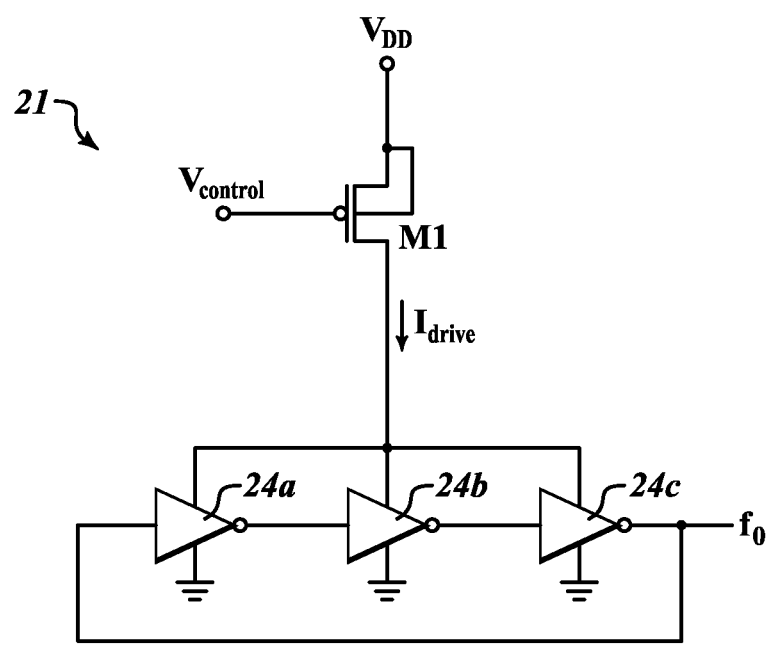
FIG. 1 is a schematic diagram of a known voltage-controlled oscillator.

Thus, a variable control voltage is not applied to the gate of the drive transistor in the current mirror circuit 32 as it was done in the voltage-controlled oscillator 21 of FIG. 1. The large size of the transistor M1, as well as the variable control voltage $V_{control}$ being applied to the gate terminal of the transistor M1 of FIG. 1, led to the very large gain of the voltage-controlled oscillator 21 of FIG. 1.

Implementing a current mirror circuit 32 to supply the drive current to the voltage-controlled oscillator 22 and using tuning capacitors greatly reduces the overall gain of the voltage-controlled oscillator 22. The current mirror circuit 32 provides a drive current that varies with process and temperature. But the correct frequency is reached by varying capacitors by varying Vcontrol. Likewise, the gain of the voltage-controlled oscillator 21 is greatly reduced.

By reducing the gain of the voltage-controlled oscillator 21 by factor of N, the resistance noise in the loop filter 28 is reduced by a factor of $N^2$. To get the same amount of noise as in the high gain voltage-controlled oscillator 21 of FIG. 1, the resistance in the loop filter 28 can be increased by $N^2$. This means that the capacitance in the loop filter can be reduced by $N^2$. Reducing the size of the capacitor in the loop filter 28 corresponds to a greatly reduced size of the loop filter 28 overall.

In one example, the current mirror circuit 32 and filter 34 and tuning capacitors reduce the gain of the voltage-controlled oscillator 22 by a factor of 10 with respect to the voltage-controlled oscillator 21 of FIG. 1. This means that the size of the loop filter 28 can be reduced by a factor of about 100 in order to obtain noise characteristics similar to those of the voltage-controlled oscillator 21 of FIG. 1. Because the loop filter 28 consumes by far the largest portion of the area of the phase locked loop 25, the overall area of the phase locked loop 25 is greatly reduced.

One drawback of implementing a current mirror circuit to supply the drive current to the voltage-controlled oscillator 22 is that the bias current from the current mirror circuit may come from a current reference such as a bandgap circuit or other noisy circuit. The phase noise of the voltage-controlled oscillator 22 can become very high and could possibly render the voltage-controlled oscillator 22 unusable.

However, the current mirror circuit 32 of FIG. 2 includes a filter 34. The filter 34 helps to filter the noise generated by the bias current generator. Thus the filter 34 alleviates the potential disadvantages of using a current mirror circuit to supply the drive current to the voltage-controlled oscillator 22.

In one embodiment, the filter 34 includes two or more switches coupled between a drain of the bias transistor and bias current generator. The gate terminal of the bias transistor is electrically coupled to a node between the drain terminal of the bias transistor and a bias current generator. The filter also includes a capacitor coupled between a gate terminal of the bias transistor and the supply voltage. The switches are modulated with a relatively small duty cycle. By switching the switches such that they are on for a short time period and then off for longer time period, the voltage on the gate terminals of the bias and drive transistors slowly arrives at a steady state voltage according to the bias current. Once the gate terminals of the drive and bias transistors reach the steady-state voltage, they are relatively unaffected by noise in the bias current because the switches are off most of the time. The noise from the bias current therefore does not greatly affect the gate voltage of the drive transistor. Thus, there will be very little noise in the drive current. There will be very little noise contribution of the bias current in output of the voltage-controlled oscillator 22 as well.

In this way, a voltage-controlled oscillator having very low gain and very low noise can be implemented. Or this leads to a large reduction in the area of the capacitor of the loop filter 28 and therefore in the area of the phase locked loop 25. This leaves more room in the integrated circuit in which the phase locked loop is implemented for other circuitry or an overall reduction in size of the integrated circuit die. Or the advantage can be distributed evenly to reduce noise and area, for example by reducing the thermal noise of the loop filter resistance by N times and reducing the size of the loop filter capacitor by N times.

Figure 3:
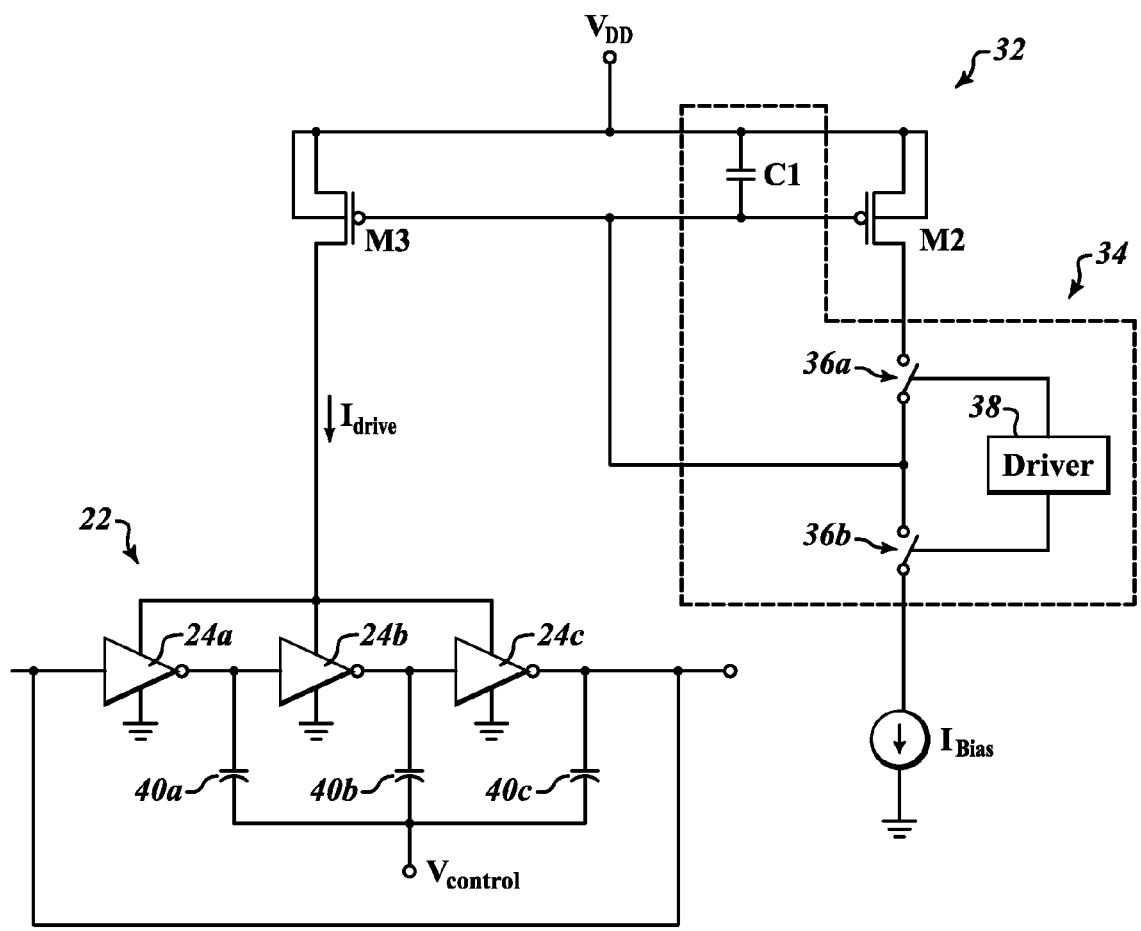
FIG. 3 is a schematic diagram of a voltage-controlled oscillator and current mirror circuit according to one embodiment.

FIG. 3 is a schematic diagram of the voltage-controlled oscillator 22 and the current mirror circuit 32 according to one embodiment. The voltage-controlled oscillator 22 includes inverters 24a-24c connected together in series. The inverters 24a-24c each have respective first supply terminals coupled to the transistor M3 and second supply terminals coupled to ground. The output of the inverter 24c is coupled to the input of the inverter 24a. A capacitor 40a has a first terminal coupled between the inverters 24a and 24b. A second terminal of the capacitor 40a is coupled to a voltage terminal Vcontrol. A capacitor 40b has a first terminal coupled between inverters 24b and 24c. A second terminal of the capacitor 40b is coupled to the voltage terminal Vcontrol. A capacitor 40c has a first terminal coupled to the output of the inverter 24c and a second terminal coupled to the voltage terminal Vcontrol. The voltage Vcontrol is output from the loop filter 28.

The current mirror circuit 32 includes a bias current generator generating a bias current Ibias. The current mirror circuit 32 further includes a PMOS bias transistor M2 having a drain terminal coupled to the bias current generator via a filter 34. The filter 34 includes switches 36a, 36b, and the driver circuit 38 and the capacitor C1. The driver circuit 38 is coupled to the switches 36a and 36b and configured to drive the switches 36a and 36b. The gate terminal of the transistor M2 is coupled to a node between the switches 36a and 36b. A PMOS driving transistor M3 has a gate terminal coupled to the bias transistor M2 in a current mirror configuration. The source terminals of the transistors M2 and M3 are both coupled to a voltage supply terminal VDD. A capacitor C1 is coupled between the source and gate terminals of the transistors M2 and M3.

The voltage-controlled oscillator 22 of FIG. 3 operates in a similar fashion to the voltage-controlled oscillator 21 of FIG. 1. In particular, the voltage-controlled oscillator 22 outputs an oscillator signal having frequency $f_0$ at the output terminal of the inverter 24c. The oscillator signal is fed back to the input of the inverter 24a as described previously in relation to FIG. 1.

The current mirror circuit 32 functions in the following manner when the switches 36a and 36b are closed: The bias current generator generates a current Ibias which is conducted through the drain of the bias transistor M2. Because the gate of the bias transistor M2 is coupled to the drain of the bias transistor M2, as the bias current Ibias passes through the drain of the bias transistor M2, the voltage on the gate of the bias transistor M2 is brought to that level that will cause the transistor M2 to conduct all of the bias current Ibias. The current $I_D$ passing through a transistor in saturation mode approximately follows the following relation:

$$I_D = \mu_p (C_{ox}/2)(W/L)(V_{gs} - V_{th})^2,$$

where $\mu_p$ is the carrier mobility for holes, $C_{ox}$ is the capacitance between the gate electrode and the source, drain, and body regions of the transistor, W/L is the ratio of the channel width to the channel length, $V_{th}$ is the thermal voltage, and $V_{gs}$ is the difference between the gate and source voltages of the transistor. As can be seen from this expression, the drain current is dominated by the voltage difference $V_{gs}$ between the gate and source terminals of the transistor. The drain current increases according to the square of the gate to source voltage $V_{gs}$. Thus, as current passes through the drain of the transistor M2, the gate voltage will approach that level that will cause it to pass the entirety of the bias current Ibias.

The drive transistor M3 is coupled to the transistor M2 in a current mirror configuration. Because the gates of the transistors M2 and M3 are coupled together, they are the same gate voltage. The source terminals of the transistors M2 and M3 are also held at the same voltage, VDD. Thus, the current passing through transistor M3 mirrors the current passing through the transistor M2 so long as the width to length ratios, carrier mobilities, and oxide capacitances of the transistors M2 and M3 are the same or it can multiply current Ibias if width to length ratios of drive transistor M3 is a multiple of that of transistor M2. Thus, the drive current Idrive conducted by the transistor M3 will be proportional to the bias current Ibias passing through the transistor M2.

In this way a steady drive current Idrive is supplied to the voltage-controlled oscillator 22. The drive current Idrive will be proportional to the bias current Ibias and will not fluctuate greatly. This does the coarse control and capacitors 40a-40c do fine control and so the gain of the voltage-controlled oscillator 22 is very small. Having a small gain allows for the advantages in reducing the area of the capacitor in the loop filter 28.

However, as described previously, noise can enter into the current mirror circuit 32 via the bias current generator if other measures are not taken to avoid this. For this reason the filter 34 is coupled between the drain of the transistor M2 and the bias current generator Ibias.

The filter 34 functions in the following manner: when the current mirror circuit 32 first receives power, the bias current generator tries to generate current Ibias. However, the switches 36a and 36b are initially open. No current flows through the transistor M2 when the switches 36a and 36b are open. The driver 38, which controls the switches 36a and 36b in unison, closes the switches 36a and 36b for a brief period. When the switches 36a and 36b are closed transistor M2 begins to conduct a portion of the bias current Ibias. During this brief period in which the switches 36a and 36b are closed, the voltage at the gate terminal of the transistor M2 begins to drop so that the transistor M2 begins to conduct current. However, the switches 36a and 36b are quickly opened again before the gate terminal of the transistor M2 can reach the low-voltage at which the full bias current Ibias would be conducted through the transistor M2. While the switches 36a and 36b are open, the voltage on the gate terminal of the transistor M2 remains constant. The switches 36a and 36b are then closed again and the larger current is conducted to transistor M2. The voltage on the gate of the transistor M2 decreases slightly again during this period in which the switches 36a and 36b are closed. The switches 36a and 36b are then opened again. The switches 36a and 36b are opened and closed in this manner throughout the operation of the current mirror circuit 32 and the voltage-controlled oscillator 22.

Eventually, the voltage on the gate of the transistor M2 decreases to the voltage which will cause the transistor M2 to conduct the full amount of the bias current Ibias during those periods in which the switches 36a and 36b are closed. The gate of the transistor M3 is electrically connected to the gate of the transistor M2. Thus, as the voltage on the gates of the transistors M2 and M3 reaches a steady-state voltage, the transistor M3 conducts the full current Idrive. The transistor M3 conducts the full current Idrive even when the switches 36a and 36b are open. This is because the voltage on the gate of the transistor M3 is constant and there is interruption in the current path for Idrive like there is for the current Ibias.

This periodic opening and closing of the switches 36a and 36b very effectively eliminates noise from the bias current generator Ibias that might otherwise appear in the drive current Idrive supplied to the voltage-controlled oscillator 22. The reason for this is that the duty cycle of the switches 36a and 36b is very small according to one embodiment. This means that the switches 36a and 36b are open for a far greater portion of the time than they are closed. As the voltage on the gate of the transistors M2 and M3 can change only when the switches 36a and 36b are closed, very little noise from the bias current generator appears on the gate terminals of the transistors M2 and M3. The capacitor C1 greatly helps in eliminating noise. The capacitor C1 acts as a charge storage that has the effect of making any change in the voltage at the gate electrodes of the transistors M2 and M3 happen very slowly. This is because the voltage at the gate terminals of the transistors M3 and M2 can only change as quickly as charge can accumulate in the capacitor C1. The larger the capacitor C1, the greater the noise filtering effect it will have.

In one embodiment, the duty cycle of the switches 36a and 36b is less than 0.1, for example about 0.01. In this example the periods during which the switches 36a and 36b are open are 100 times longer than the periods during which the switches 36a and 36b are closed. In particular, in this example the switches 36a and 36b are closed for period of about 100 ns. The switches 36a and 36b are then opened for period of about 10 μs. In this manner, the driver 38 opens and closes the switches 36a and 36b with the selected duty cycle.

Because the current mirror circuit 32 is implemented along with the capacitors 40a-40c as shown in FIG. 3, the gain of the voltage-controlled oscillator 22 is greatly reduced. The capacitors 40a-40c are variable capacitors whose capacitances can be adjusted. By adjusting the capacitances of the capacitors 40a-40c the output frequency $f_0$ can be adjusted.

In one embodiment, the capacitors 40a-40c are MOS or diode-based capacitors. For example, the terminals of the capacitors 40a-40c coupled to the voltage Vcontrol are the gate terminals of MOS transistors. The other terminals of capacitors 40a-40c are the source, drain, and/or body terminals of the MOS transistors. By applying a voltage to the gate terminal of the MOS transistors, the capacitances between the gate terminal and the source, drain, and/or body terminals can be adjusted. In this way the output frequency of the voltage-controlled oscillator 22 can be adjusted by adjusting the voltage Vcontrol. This is because as the capacitance of the output nodes of the inverters 24a-24c increases, it takes longer for the inverters 24a-24c to transition between the high and low states. Thus, as the output frequency $f_0$ of the voltage-controlled oscillator 22 is inversely proportional to the time it takes for each inverter 24a-24c to transition between high and low states, the output frequency $f_0$ is inversely proportional to the capacitance of the capacitors 40a-40c.

Figure 4:
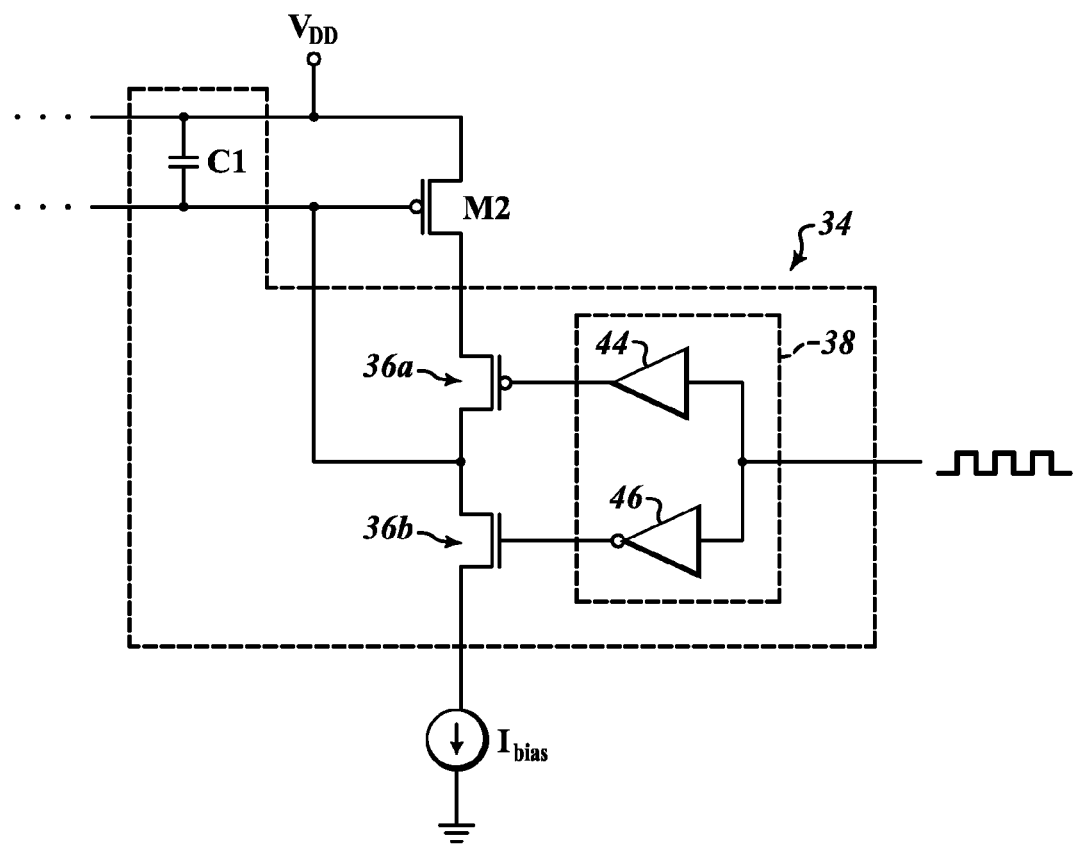
FIG. 4 is a schematic diagram of a filter portion of a current mirror circuit according to one embodiment.

FIG. 4 is a schematic diagram of the filter 34 of the current mirror circuit 32 according to one embodiment. In the embodiment of FIG. 4, the switches 36a and 36b are MOS transistors. In particular, the switch 36a is a PMOS transistor and the switch 36b is an NMOS transistor. A driving signal is provided by a controller to the driver circuit 38. The driver circuit 38 includes an inverter with an output coupled to the gate of the NMOS transistor 36b, and a buffer having an output coupled to the gate of the PMOS transistor 36a.

When the driving signal is high, the buffer supplies a high-voltage signal to the PMOS transistor 36a and the inverter supplies a low signal to the gate of the transistor 36b. This results in the transistors 36a and 36b being in the off state. When the transistors 36a and 36b are in the off state, no current is conducted to the transistor M2. When a driving signal is low, the buffer supplies a low-voltage signal to the PMOS transistor 36a while the inverter supplies a high-voltage signal to the NMOS transistor 36b. This results in both transistors 36a and 36b being in the on state. When the transistors 36a and 36b are in the on state the bias current Ibias is conducted by the transistor M2.

While the switches 36a and 36b have been disclosed as respective PMOS and NMOS transistors, many other arrangements are possible as will be clear to those of skill in the art. All such other arrangements for implementing a filter 34 fall in the scope of the present disclosure.

Figure 5:
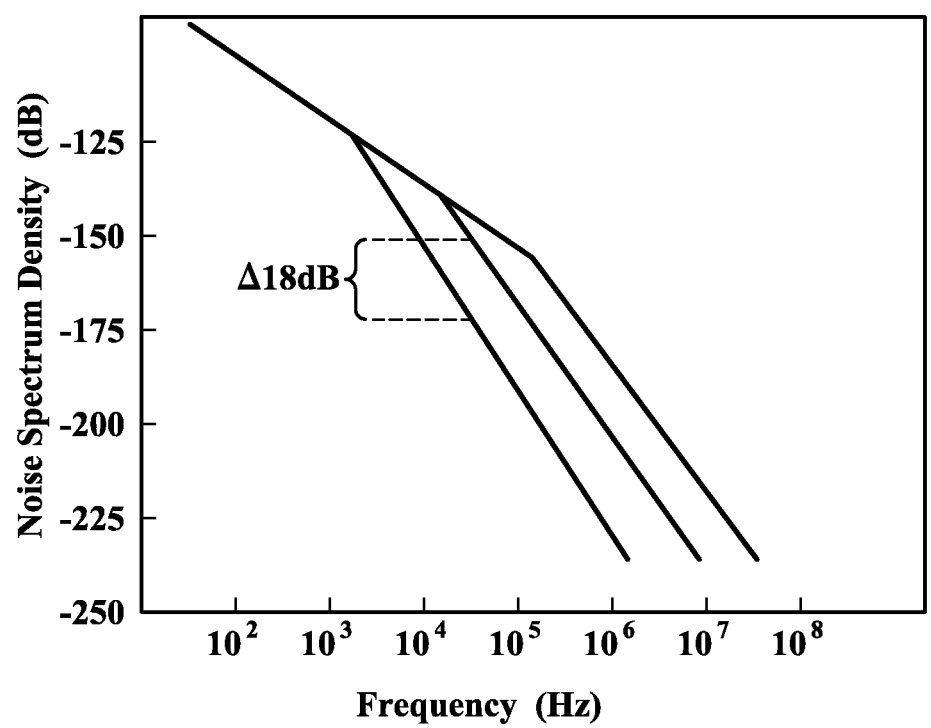
FIG. 5 is a graph of noise spectrum density of the oscillation signal vs. noise frequency with varying duty cycle of a clock, according to one embodiment.

FIG. 5 is a graph of the noise spectrum density versus frequency for three different duty cycles of the switches 36a, 36b. For each duty cycle a pole appears in the plot at a different frequency. For the smallest duty cycle, about 0.01, a pole appears at a frequency of about 1 kHz at which point the noise density begins to decrease at a higher rate with increasing frequency. For a duty cycle of about 0.1, a pole appears at a frequency of about 10 kHz, at which point the noise begins to decrease at a higher rate with increasing frequency. For a duty cycle about 0.5, a pole appears at about 100 kHz. As can be seen from the graph, because the pole is introduced earlier for the duty cycle 0.01, the noise spectrum density is much lower at any given frequency than for the other two duty cycles. This illustrates that a small duty cycle correlates to a reduction in noise.

Figure 6:
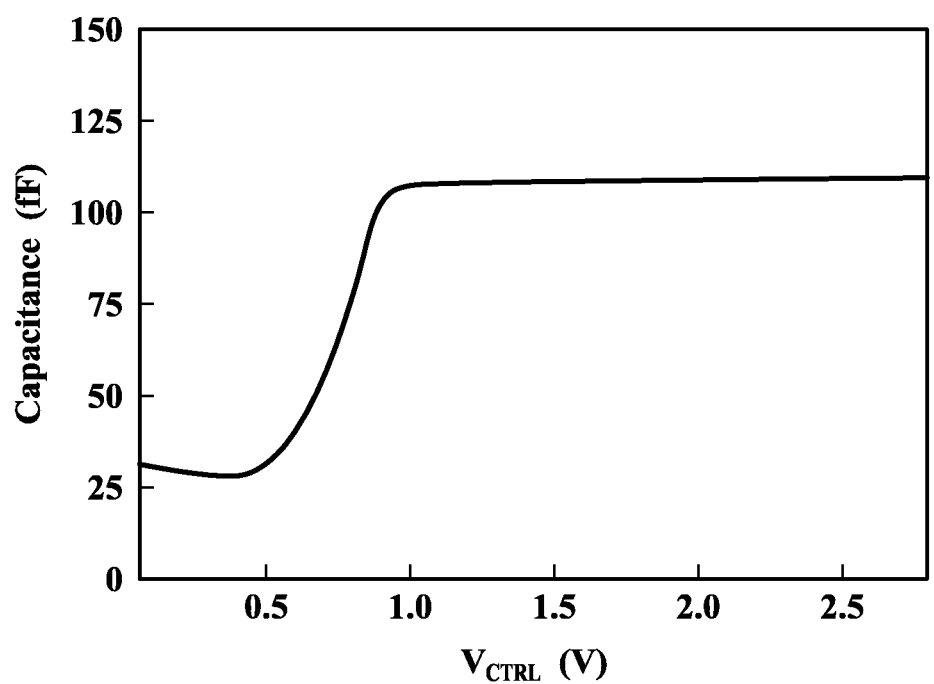
FIG. 6 is a graph of the capacitance of tuning capacitors of a voltage-controlled oscillator vs. the control voltage on the one terminal of the capacitors according to one embodiment.

FIG. 6 is a graph of the capacitance of the capacitors 40a-40c versus Vcontrol, wherein the capacitors 40a-40c are MOS-based capacitors. As can be seen, the capacitance of the capacitors 40a-40c increases by about 75 fF as Vcontrol increases between about 0.5 and 1.0 V. This change in capacitance corresponds to a change in the output frequency $f_0$ of the oscillator signal of the voltage-controlled oscillator 22.

Figure 7A:
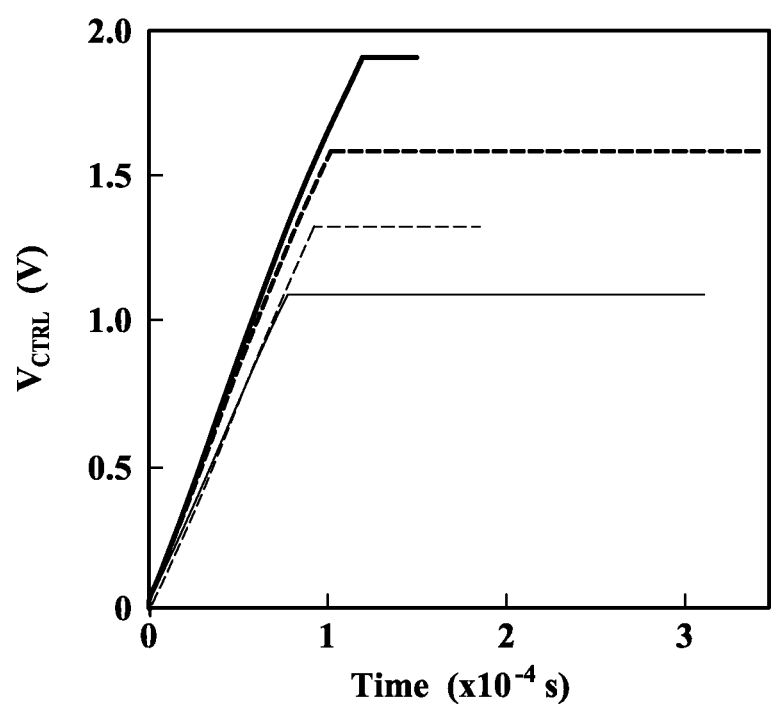
FIG. 7A is a graph of control voltage of a capacitor vs. time according to one embodiment.

FIG. 7A is a graph of the voltage Vcontrol at which a phase locked loop 25 locks voltage-controlled oscillators to a frequency of 1.5 GHz across process, voltage, and temperature, and the amount of time required to reach that voltage. The phase locked loop 25 automatically adjusts the voltage Vcontrol to whatever voltage will cause the voltage-controlled oscillator to lock at 1.5 GHz.

Figure 7B:
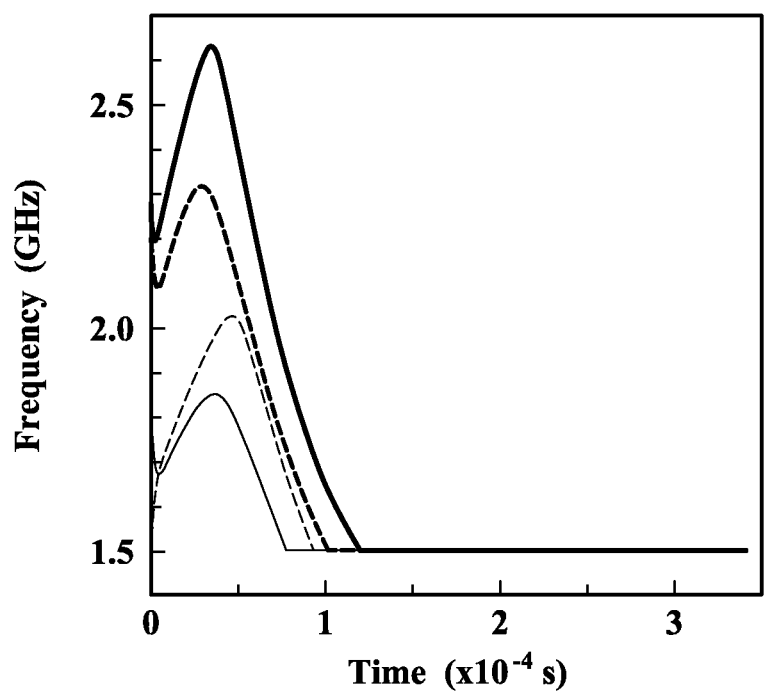
FIG. 7B is a graph of output frequency of an oscillation signal vs. time according to one embodiment.

FIG. 7B is a graph that shows the frequency of the voltage-controlled oscillators of FIG. 7A versus time. FIG. 7B illustrates that across process, voltage, and temperature of the voltage-controlled oscillators locked in at the target frequency of 1.5 GHz.

Figure 8:
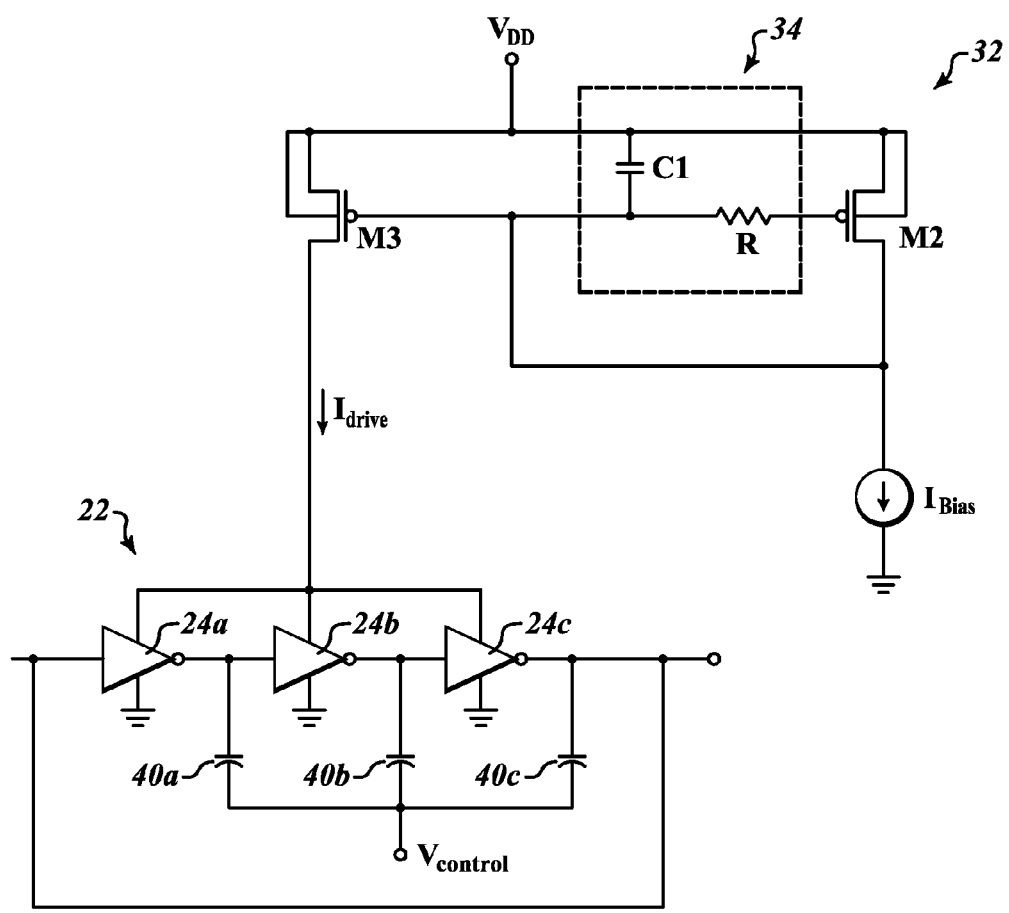
FIG. 8 is a schematic diagram of a voltage-controlled oscillator and current mirror circuit according to one embodiment.

FIG. 8 is a schematic diagram of a voltage-controlled oscillator and current mirror circuit according to one embodiment. The circuit of FIG. 8 is similar to the circuit of FIG. 3. However, in the circuit of FIG. 8, the switches 36a and 36b are not present. Instead, the filter 34 includes a filter resistor R coupled between the capacitor C1 and the Transistor M2. The filter resistor R performs a similar function as the switches 36a and 36b. Advantageously, the switches 36a, 36b, and the driver 38 are not included. This reduces the complexity of the circuit while achieving much of the benefit of the filter 34 of FIG. 3.

In one embodiment, the resistor R has a large resistance such as 1 kΩ-1MΩ or higher. The value of the resistor R can be selected in accordance with the particular design of the current mirror circuit 32.

One potential drawback of including a resistor R instead of the switches 36a and 36b is that some thermal noise from the resistor R will be introduced into the current Idrive. Nevertheless, this embodiment still provides an overall reduction in noise.

Those of skill in the art will recognize that a filter 34 can be implemented in many other ways in light of the present disclosure. All such other embodiments fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
a ring oscillator configured to output an oscillator signal;
a first capacitor having a first terminal coupled to an output of the ring oscillator and a second terminal coupled to a variable control voltage, a capacitance between the first terminal and the second terminal of the first capacitor varying based on the variable control voltage, the first capacitor being configured to fine-frequency tune a frequency of the oscillator signal output from the ring oscillator;
a first transistor configured to supply a drive current to the ring oscillator;
a second transistor coupled to the first transistor in a current mirror configuration;
a bias current generator configured to pass a bias current through the second transistor, a gate terminal of the second transistor being electrically connected to a node between a drain terminal and the bias current generator;
a first switch coupled between the node and the drain terminal of the second transistor;
a second switch coupled between the node and the bias current generator;
a frequency divider configured to receive an oscillator signal output from the ring oscillator and to output a divided oscillator signal;
a phase detector configured to receive the divided oscillator signal and an input oscillator signal and to output a phase difference signal indicative of a phase difference between the divided oscillator signal and the input oscillator signal; and
a loop filter coupled between the phase detector and the ring oscillator, the loop filter being configured to filter the phase difference signal output from the phase detector and to output the variable control voltage to the second terminal of the first capacitor.

2. The device of claim 1 comprising a driver coupled to the first and second switches and configured to drive the first and second switches.

3. The device of claim 2 wherein the driver is configured to turn on the first and second switches at the same time and to turn off the first and the second switches simultaneously.

4. The device of claim 2 wherein the first and second switches are transistors.

5. The device of claim 4 wherein the first switch is a PMOS transistor and the second switch is an NMOS transistor.

6. The device of claim 5 wherein the driver includes an inverter and buffer each configured to receive a driving signal and to drive a respective one of the first and second switches.

7. The device of claim 2 wherein the driver is configured to drive the first and the second switches with a duty cycle less than 1.

8. The device of claim 7 wherein the driver circuit is configured to drive the first and the second switches with a duty cycle less than 0.01.

9. The device of claim 1 wherein the ring oscillator includes an odd number of inverters connected in series.

10. The device of claim 9 comprising a plurality of second capacitors, each of the second capacitors having a first terminal coupled between two of the inverters and a second terminal coupled to the variable control voltage, a capacitance of each of the second capacitors varying based on the variable control voltage.

11. The device of claim 1 comprising a capacitor coupled between the gate terminal of the second transistor and the voltage supply terminal.

12. An integrated circuit die comprising:
a bias current generator configured to generate a bias current;
a first transistor having a drain terminal coupled to the bias current generator and configured to pass the bias current;
a second transistor having a gate terminal coupled to the gate terminal of the first transistor, and a source terminal coupled to a source terminal of the first transistor, the second transistor being configured to pass a drive current;
a first switch coupled between the drain terminal of the first transistor and the bias current generator;
a second switch coupled between the first switch and the bias current generator, a gate terminal of the first transistor being electrically connected to the first and the second switch;
a driver circuit coupled to the first and second switches and configured to turn the first and second switches on and off in unison;
a first capacitor coupled between a gate of the first transistor and a voltage supply terminal;

a voltage-controlled oscillator coupled to the second transistor and configured to receive the drive current and to generate an oscillator signal, the voltage-controlled oscillator including an odd number of inverters connected in series;

a second capacitor having a first terminal coupled to an output of the voltage-controlled oscillator and a second terminal coupled to a variable control voltage, a capacitance between the first terminal and the second terminal of the second capacitor varying based on the variable control voltage, the second capacitor being configured to fine-frequency tune a frequency of the oscillator signal output from the voltage-controlled oscillator;

a frequency divider configured to receive the oscillator signal output from the voltage-controlled oscillator and to output a divided oscillator signal;

a phase detector configured to receive the divided oscillator signal and an input oscillator signal and to output a phase difference signal indicative of a phase difference between the divided oscillator signal and the input oscillator signal; and a loop filter coupled between the phase detector and the voltage-controlled oscillator, the loop filter being configured to filter the phase difference signal output from the phase detector and to output the variable control voltage to the second terminal of the second capacitor.

13. The integrated circuit die of claim 12 comprising a plurality of second capacitors, each of the second capacitors having a first terminal coupled between two of the inverters and a second terminal coupled to the variable control voltage, a capacitance of each of the second capacitors varying based on the variable voltage.

14. The integrated circuit die of claim 12 wherein the driver circuit is configured to drive the first and second switches with a duty cycle less than 0.1.

15. A method comprising:
generating a bias current in a bias current generator;
passing the bias current through a first transistor, a gate terminal of the first transistor being coupled to a node between a drain terminal of the first transistor and the bias current generator;
passing a drive current through a second transistor having a gate terminal coupled to the gate terminal of the first transistor and a source terminal coupled to a source terminal of the first transistor;
driving a first switch and a second switch in unison, the first switch being coupled between the node and the drain terminal of the first transistor, the second switch being coupled between the node and the bias current generator;
supplying a voltage from a voltage supply terminal to a first capacitor coupled to the gate terminal of the first transistor;
passing the drive current from the second transistor to a voltage-controlled oscillator including an odd number of inverters connected in series, the second transistor having a gate and a source terminal coupled to the second transistor in a current mirror configuration;
outputting an oscillation signal from the voltage-controlled oscillator;
passing the oscillation signal from the voltage-controlled oscillator to a frequency divider;
passing a divided oscillator signal from the frequency divider to a phase detector;

passing a phase difference signal indicative of a phase difference between the divided oscillator signal and an input oscillator signal from the phase detector to a loop filter;

filtering the phase difference signal using the loop filter to obtain a variable control voltage;

outputting the variable control voltage from the loop filter;

passing the variable control voltage from the loop filter to a second terminal of a second capacitor having a first terminal coupled to an output of the voltage-controlled oscillator;

varying a capacitance between the first terminal and the second terminal of the second capacitor based on the variable control voltage; and fine tuning a frequency of the oscillation signal output from the voltage-controlled oscillator based on the capacitance between the first terminal and the second terminal of the second capacitor based on the variable control voltage.

16. The method of claim 15 comprising driving the first and second switches with a duty cycle less than 0.05.

17. The method of claim 15 comprising adjusting the capacitance of the second capacitor by applying the variable control voltage to a second terminal of the capacitor.

18. The method of claim 17 wherein adjusting the capacitance of the second capacitor adjusts the frequency of the oscillation signal.

19. A device comprising:
a ring oscillator configured to output an oscillator signal;
a first capacitor having a first terminal coupled to an output of the ring oscillator and a second terminal coupled to a variable control voltage, the first capacitor being configured to fine-frequency tune a frequency of the oscillator signal output from the ring oscillator;
a first transistor configured to supply a drive current to the ring oscillator;
a second transistor coupled to the first transistor in a current mirror configuration;
a bias current generator configured to pass a bias current through the second transistor, a gate terminal of the second transistor being electrically connected to a node between a drain terminal of the second transistor and the bias current generator;
a first switch coupled between the node and the drain terminal of the second transistor;
a second switch coupled between the node of the second transistor and the bias current generator;
a frequency divider, which in operation, receives an oscillator signal output from the ring oscillator and outputs a divided oscillator signal;
a phase detector, which in operation, receives the divided oscillator signal and an input oscillator signal and outputs a phase difference signal indicative of a phase difference between the divided oscillator signal and the input oscillator signal; and
a loop filter, which in operation, filters the phase difference signal output from the phase detector and outputs the variable control voltage to the second terminal of the first capacitor.

20. The device of claim 19 wherein the ring oscillator includes an odd number of inverters connected in series, the device comprising a plurality of second capacitors, each of the second capacitors having a first terminal coupled between two of the inverters and a second terminal coupled to the variable control voltage output from the loop filter.

* * * * *